United States Patent
Chou

(10) Patent No.: US 7,460,292 B2
(45) Date of Patent: Dec. 2, 2008

(54) INTERFEROMETRIC MODULATOR WITH INTERNAL POLARIZATION AND DRIVE METHOD

(75) Inventor: Chen-Jean Chou, New City, NY (US)

(73) Assignee: QUALCOMM MEMS Technologies, Inc., San Diego, CA (US)

( * ) Notice: Subject to any disclaimer, the term of this patent is extended or adjusted under 35 U.S.C. 154(b) by 327 days.

(21) Appl. No.: 11/145,416

(22) Filed: Jun. 3, 2005

(65) Prior Publication Data

US 2006/0274398 A1    Dec. 7, 2006

(51) Int. Cl.
G02B 26/00 (2006.01)

(52) U.S. Cl. .................. 359/291; 359/223; 359/247; 359/627; 359/846

(58) Field of Classification Search ........... 359/223, 359/224, 247, 290, 291, 568, 627, 846, 847; 348/772

See application file for complete search history.

(56) References Cited

U.S. PATENT DOCUMENTS

| | | |
|---|---|---|
| 3,728,030 A | 4/1973 | Hawes |
| 4,196,396 A | 4/1980 | Smith |
| 4,463,336 A | 7/1984 | Black |
| 5,315,370 A | 5/1994 | Bulow |
| 5,345,328 A | 9/1994 | Fritz et al. |
| 5,381,232 A | 1/1995 | Van Wijk |
| 5,614,937 A | 3/1997 | Nelson |
| 5,867,302 A | 2/1999 | Fleming |
| 6,028,689 A | 2/2000 | Michalicek et al. |
| 6,239,777 B1 | 5/2001 | Sugahara et al. |
| 6,327,071 B1 | 12/2001 | Kimura |
| 6,356,378 B1 | 3/2002 | Huibers |
| 6,438,282 B1 | 8/2002 | Takeda et al. |

(Continued)

FOREIGN PATENT DOCUMENTS

| | | |
|---|---|---|
| DE | 4108966 A1 | 8/1992 |
| DE | 10228946 A1 | 1/2004 |
| EP | 0310176 A2 | 4/1989 |
| EP | 1473581 A2 | 11/2004 |
| JP | 2002-062490 | 2/2000 |

(Continued)

OTHER PUBLICATIONS

Chiou et al., A Novel Capacitance Control Design Of Tunable Capacitor Using Multiple Electrostatic Driving Electrodes, *Proceedings of the 2001 1st Conference on Nanotechnology*, Oct. 28-30, 2001, pp. 319-324.

(Continued)

*Primary Examiner*—Joseph Martinez
(74) *Attorney, Agent, or Firm*—Knobbe, Martens, Olson & Bear, LLP

(57) ABSTRACT

A method of creating an internal dipole moment in an interferometric light modulating device is disclosed. In certain embodiments, the method includes applying heat and an electrical field to a dielectric layer of an interferometric light modulating device. Before this method, the dielectric layer has mobile charges or includes random dipoles. After this method, however, those random dipoles are substantially aligned, thereby inducing a fixed dipole moment in the dielectric layer. The electric field creates the dipole moment in the dielectric layer and the heat helps increase the speed of the process by supplying additional activation energy. Having a dielectric layer with an induced dipole moment provides an internal voltage source that provides at least a portion of the voltage required to operate the interferometric light modulating device. The induced dipole moment also reduces the possibility of an uncontrolled shift of charge within the device during operation.

33 Claims, 9 Drawing Sheets

U.S. PATENT DOCUMENTS

| | | |
|---|---|---|
| 6,466,190 B1 | 10/2002 | Evoy |
| 6,680,792 B2 | 1/2004 | Miles |
| 6,698,295 B1 | 3/2004 | Sherrer |
| 6,747,800 B1 | 6/2004 | Lin |
| 6,841,081 B2 | 1/2005 | Chang et al. |
| 6,870,654 B2 | 3/2005 | Lin et al. |
| 6,882,458 B2 | 4/2005 | Lin et al. |
| 6,882,461 B1 | 4/2005 | Tsai et al. |
| 6,912,022 B2 | 6/2005 | Lin et al. |
| 6,940,630 B2 | 9/2005 | Xie |
| 6,947,200 B2 | 9/2005 | Huibers |
| 6,952,303 B2 | 10/2005 | Lin et al. |
| 6,958,847 B2 | 10/2005 | Lin |
| 6,980,350 B2 | 12/2005 | Hung et al. |
| 7,123,216 B1 | 10/2006 | Miles |
| 7,126,738 B2 * | 10/2006 | Miles .................... 359/245 |
| 7,236,284 B2 | 6/2007 | Miles |
| 2002/0075555 A1 | 6/2002 | Miles |
| 2002/0167072 A1 | 11/2002 | Andosca |
| 2002/0186483 A1 | 12/2002 | Hagelin |
| 2003/0015936 A1 | 1/2003 | Yoon et al. |
| 2003/0029705 A1 | 2/2003 | Qui et al. |
| 2003/0035196 A1 | 2/2003 | Walker |
| 2003/0043157 A1 | 3/2003 | Miles |
| 2003/0202265 A1 * | 10/2003 | Reboa et al. .............. 359/877 |
| 2003/0210851 A1 | 11/2003 | Fu et al. |
| 2004/0008396 A1 | 1/2004 | Stappaerts |
| 2004/0043552 A1 | 3/2004 | Strumpell et al. |
| 2004/0051929 A1 | 3/2004 | Sampsell et al. |
| 2004/0056742 A1 | 3/2004 | Dabbaj |
| 2004/0100594 A1 | 5/2004 | Huibers et al. |
| 2004/0125281 A1 | 7/2004 | Lin et al. |
| 2004/0125347 A1 | 7/2004 | Patel et al. |
| 2004/0136045 A1 | 7/2004 | Tran |
| 2004/0145811 A1 | 7/2004 | Lin et al. |
| 2004/0147198 A1 | 7/2004 | Lin et al. |
| 2004/0150939 A1 | 8/2004 | Huff |
| 2004/0175577 A1 | 9/2004 | Lin et al. |
| 2004/0184766 A1 | 9/2004 | Kim et al. |
| 2004/0201908 A1 | 10/2004 | Kaneko |
| 2004/0207897 A1 | 10/2004 | Lin |
| 2004/0209192 A1 | 10/2004 | Lin et al. |
| 2004/0209195 A1 | 10/2004 | Lin |
| 2004/0233503 A1 | 11/2004 | Kimura |
| 2005/0002082 A1 | 1/2005 | Miles |
| 2005/0003667 A1 | 1/2005 | Lin et al. |
| 2005/0024557 A1 | 2/2005 | Lin |
| 2005/0035699 A1 | 2/2005 | Tsai |
| 2005/0036095 A1 | 2/2005 | Yeh et al. |
| 2005/0036192 A1 | 2/2005 | Lin et al. |
| 2005/0042117 A1 | 2/2005 | Lin |
| 2005/0046922 A1 | 3/2005 | Lin et al. |
| 2005/0046948 A1 | 3/2005 | Lin |
| 2005/0068605 A1 | 3/2005 | Tsai |
| 2005/0068606 A1 | 3/2005 | Tsai |
| 2005/0078348 A1 | 4/2005 | Lin |
| 2005/0168849 A1 | 8/2005 | Lin |
| 2005/0179378 A1 | 8/2005 | Oooka et al. |
| 2005/0195462 A1 | 9/2005 | Lin |
| 2005/0195467 A1 | 9/2005 | Kothari et al. |
| 2005/0202649 A1 | 9/2005 | Hung et al. |
| 2005/0249966 A1 | 11/2005 | Tung et al. |
| 2006/0007517 A1 | 1/2006 | Tsai |
| 2006/0017379 A1 | 1/2006 | Su et al. |
| 2006/0024880 A1 | 2/2006 | Chui et al. |
| 2006/0065940 A1 | 3/2006 | Kothari |
| 2006/0066599 A1 | 3/2006 | Chui |
| 2006/0066640 A1 | 3/2006 | Kothari et al. |
| 2006/0066935 A1 | 3/2006 | Cummings et al. |
| 2006/0067643 A1 | 3/2006 | Chui |
| 2006/0067649 A1 | 3/2006 | Tung et al. |
| 2006/0067651 A1 | 3/2006 | Chui |
| 2006/0077152 A1 | 4/2006 | Chui et al. |
| 2006/0077156 A1 | 4/2006 | Chui et al. |
| 2006/0077507 A1 | 4/2006 | Chui et al. |
| 2006/0077508 A1 | 4/2006 | Chui et al. |
| 2006/0077515 A1 | 4/2006 | Cummings |
| 2006/0077516 A1 | 4/2006 | Kothari |
| 2006/0077527 A1 | 4/2006 | Cummings |
| 2006/0079048 A1 | 4/2006 | Sampsell |
| 2006/0139723 A9 | 6/2006 | Miles |
| 2006/0220160 A1 | 10/2006 | Miles |
| 2006/0262126 A1 | 11/2006 | Miles |
| 2006/0262380 A1 | 11/2006 | Miles |
| 2006/0268388 A1 | 11/2006 | Miles |
| 2006/0274074 A1 | 12/2006 | Miles |
| 2007/0040777 A1 | 2/2007 | Cummings |
| 2007/0121118 A1 | 5/2007 | Gally et al. |
| 2007/0177247 A1 | 8/2007 | Miles |
| 2007/0194630 A1 | 8/2007 | Mingard et al. |
| 2008/0013144 A1 | 1/2008 | Chui et al. |
| 2008/0013145 A1 | 1/2008 | Chui et al. |
| 2008/0013154 A1 | 1/2008 | Chui |

FOREIGN PATENT DOCUMENTS

| | | |
|---|---|---|
| JP | 2001-221913 | 8/2001 |
| JP | 2004235465 A | 8/2004 |
| JP | 2004286825 A | 10/2004 |
| WO | WO 03/014789 A2 | 2/2003 |
| WO | WO 03/085728 A1 | 10/2003 |
| WO | WO 2005/006364 A1 | 1/2005 |

OTHER PUBLICATIONS

T. Sterken, et al., A New Power MEMS Component with Variable Capacitance, *2003 Proceedings, Pan Pacific Microelectronics Symposium*, 2003, pp. 27-34.

H. Amjadi, Electret Membranes and Backelectrodes for Application in Micromechanical Transducers, *Journal of Electrostatics*, vol. 48, No. 3-4, Mar. 2000, pp. 179-191.

M. Goel, Electret Sensors, Filters, and MEMS Devices: New Challenges in Materials Research, *Current Science*, vol. 85, No. 4, Aug. 25, 2003, pp. 443-453.

M. Ichiya, et al., Electrostatic Actuator with Electret, *IEICE Transaction on Electronics*, Electronics Society, Tokyo, JP, vol. E78-C, No. 2, Feb. 1, 1995, pp. 128-131.

International Search Report from Application No. PCT/US2006/021371, dated Nov. 3, 2006.

Written Opinion of the International Searching Authority from Application No. PCT/US2006/021371, mailed Nov. 20, 2006.

IPRP for PCT/US06/021371 filed Jun. 1, 2006.

* cited by examiner

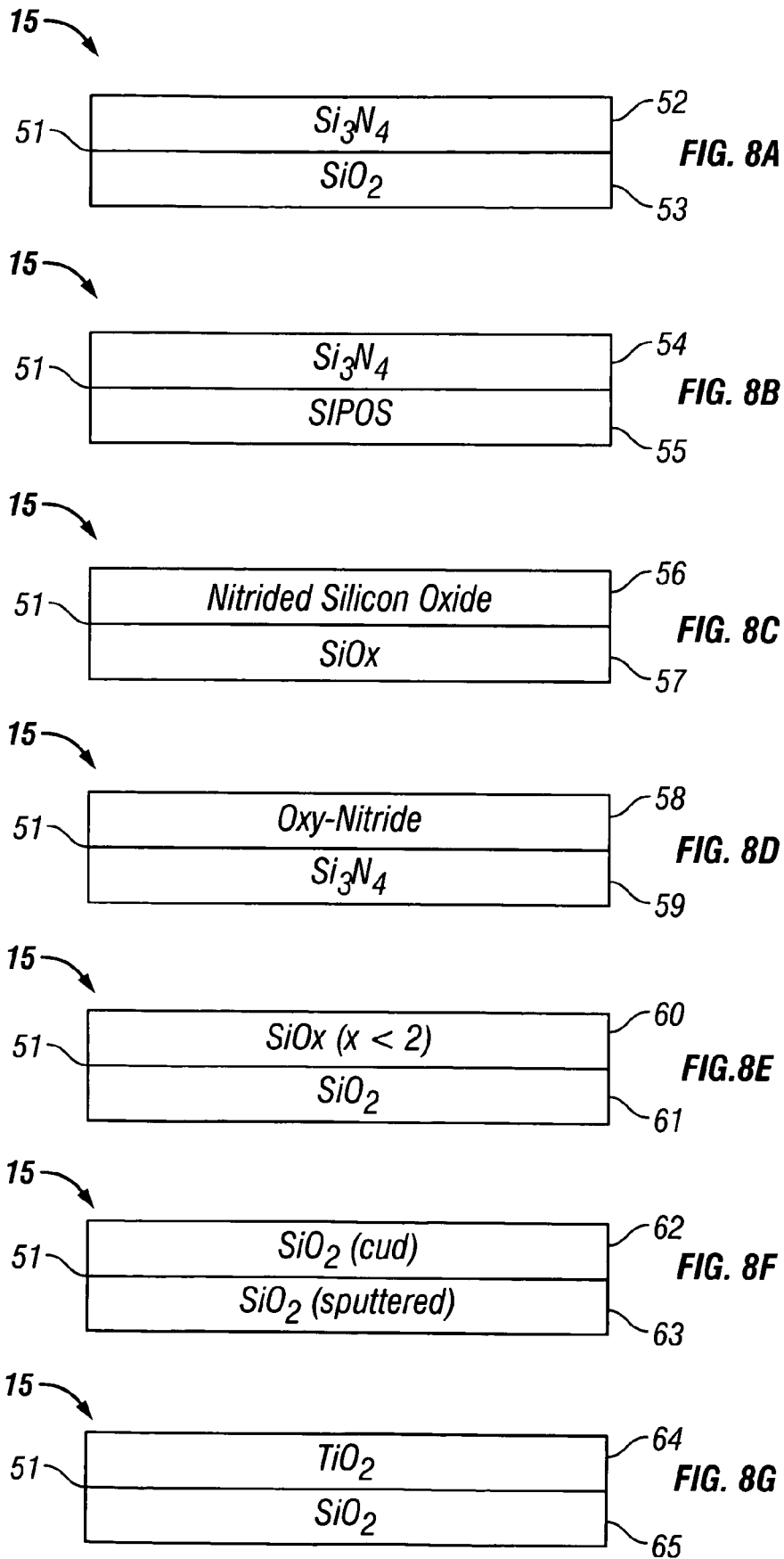

INTERFEROMETRIC MODULATOR WITH INTERNAL POLARIZATION AND DRIVE METHOD

BACKGROUND

1. Field of the Invention

The field of the invention relates to microelectromechanical systems (MEMS).

2. Description of the Related Technology

Microelectromechanical systems (MEMS) include micro mechanical elements, actuators, and electronics. Micromechanical elements may be created using deposition, etching, and or other micromachining processes that etch away parts of substrates and/or deposited material layers or that add layers to form electrical and electromechanical devices. One type of MEMS device is called an interferometric modulator. As used herein, the term interferometric modulator or interferometric light modulator refers to a device that selectively absorbs and/or reflects light using the principles of optical interference. In certain embodiments, an interferometric modulator may comprise a pair of conductive plates, one or both of which may be transparent and/or reflective in whole or part and capable of relative motion upon application of an appropriate electrical signal. In a particular embodiment, one plate may comprise a stationary layer deposited on a substrate and the other plate may comprise a metallic membrane separated from the stationary layer by an air gap. As described herein in more detail, the position of one plate in relation to another can change the optical interference of light incident on the interferometric modulator. Such devices have a wide range of applications, and it would be beneficial in the art to utilize and/or modify the characteristics of these types of devices so that their features can be exploited in improving existing products and creating new products that have not yet been developed.

SUMMARY OF CERTAIN EMBODIMENTS

The system, method, and devices of the invention each have several aspects, no single one of which is solely responsible for its desirable attributes. Without limiting the scope of this invention, its more prominent features will now be discussed briefly. After considering this discussion, and particularly after reading the section entitled "Detailed Description of Certain Embodiments" one will understand how the features of this invention provide advantages over other display devices.

In one embodiment, a method of forming a MEMS device having a first electrode and a second electrode is provided, the method comprising: providing a first layer located between the first and second electrodes; and applying heat to the first layer while applying a first voltage across the first and second electrodes.

In another embodiment, a MEMS device is provided, the MEMS device comprising: a first electrode; a second electrode; and a first layer located between the first and second electrodes, the first layer comprising a non-zero dipole moment when no voltage is applied across the first and second electrodes.

In another embodiment, a MEMS device is provided, the MEMS device comprising: a first electrode; a second electrode; and means for providing a non-zero dipole moment between the first and second electrodes when no voltage is applied across the first and second electrodes.

In another embodiment, a method of providing an operating voltage to a MEMS device is provided, the method comprising: providing a first layer comprising a first electrode; providing a second layer comprising a second electrode, wherein the second layer is movable with respect to the first layer upon application of a voltage between the first and second electrodes; providing a third layer disposed between the first and second layers, wherein third layer comprises a non-zero dipole moment when no voltage is applied across the first and second electrodes; providing the first layer with a first voltage potential; providing the second layer with a second voltage potential, wherein the second voltage potential is greater in magnitude than the first voltage potential, and wherein the operating voltage comprises the first and second voltage potentials and a third voltage potential provided by the non-zero dipole moment of the insulating material.

In another embodiment, a MEMS device is provided, the MEMS device comprising: a first layer, wherein the first layer is configured to receive a first voltage; a second layer, wherein the second layer is configured to receive a second voltage; and a third layer between the first and second layers, wherein the third layer is configured to provide a third voltage, wherein the first, second, and third voltages together substantially equal a predetermined voltage.

BRIEF DESCRIPTION OF THE DRAWINGS

FIGS. 8A-8G are cross sections of embodiments of an insulating layer.

DETAILED DESCRIPTION OF CERTAIN EMBODIMENTS

The following detailed description is directed to certain specific embodiments of the invention. However, the invention can be embodied in a multitude of different ways. In this description, reference is made to the drawings wherein like parts are designated with like numerals throughout. As will be apparent from the following description, the embodiments may be implemented in any device that is configured to display an image, whether in motion (e.g., video) or stationary (e.g., still image), and whether textual or pictorial. More particularly, it is contemplated that the embodiments may be implemented in or associated with a variety of electronic devices such as, but not limited to, mobile telephones, wireless devices, personal data assistants (PDAs), hand-held or portable computers, GPS receivers/navigators, cameras, MP3 players, camcorders, game consoles, wrist watches, clocks, calculators, television monitors, flat panel displays, computer monitors, auto displays (e.g., odometer display, etc.), cockpit controls and/or displays, display of camera views (e.g., display of a rear view camera in a vehicle), electronic photographs, electronic billboards or signs, projectors, architectural structures, packaging, and aesthetic structures (e.g., display of images on a piece of jewelry). MEMS devices of similar structure to those described herein can also be used in non-display applications such as in electronic switching devices.

In one embodiment of the invention, a method of creating an internal dipole moment in an interferometric light modulating device is disclosed. In certain embodiments, the method comprises applying heat and an electrical field to a dielectric layer of an interferometric light modulating device. Prior to implementation of this method, the dielectric layer has mobile charges or comprises random dipoles. After performance of this method, however, those random dipoles are substantially aligned, thereby inducing a substantially fixed dipole moment in the dielectric layer. The electric field creates the dipole moment in the dielectric layer and the heat helps increase the speed of the process by supplying additional activation energy. Having a dielectric layer with an induced dipole moment provides an internal voltage source that provides at least a portion of the voltage required to operate the interferometric light modulating device. The induced dipole moment also reduces the possibility of an uncontrolled shift of charge within the device during operation.

Figure 1:
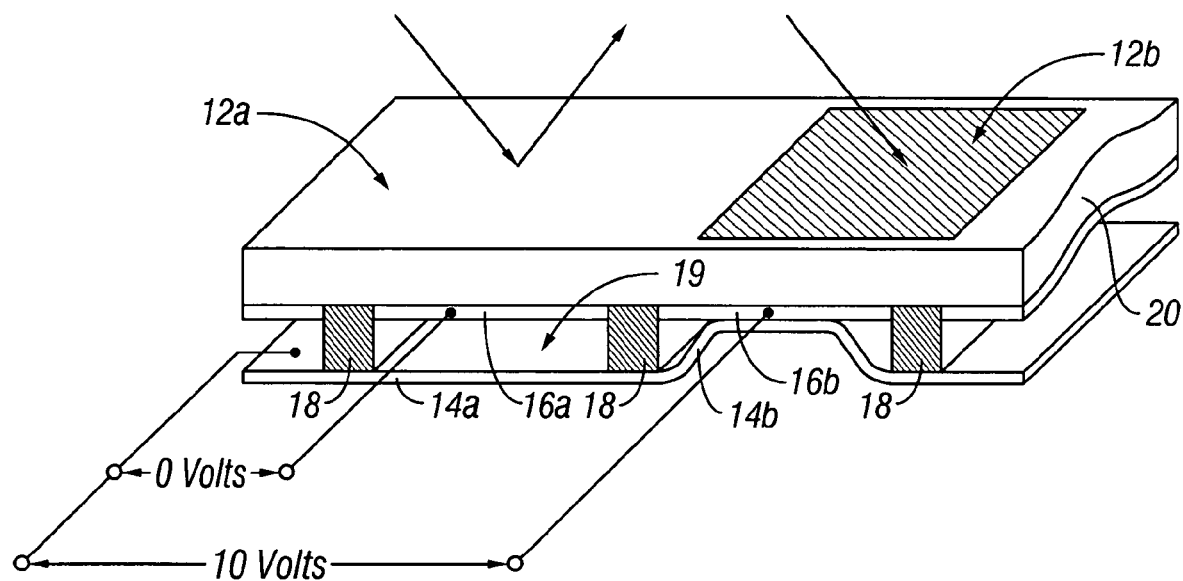
FIG. 1 is an isometric view depicting a portion of one embodiment of an interferometric modulator display in which a movable reflective layer of a first interferometric modulator is in a released position and a movable reflective layer of a second interferometric modulator is in an actuated position.

One interferometric modulator display embodiment comprising an interferometric MEMS display element is illustrated in FIG. 1. In these devices, the pixels are in either a bright or dark state. In the bright ("on" or "open") state, the display element reflects a large portion of incident visible light to a user. When in the dark ("off" or "closed") state, the display element reflects little incident visible light to the user. Depending on the embodiment, the light reflectance properties of the "on" and "off" states may be reversed. MEMS pixels can be configured to reflect predominantly at selected colors, allowing for a color display in addition to black and white.

FIG. 1 is an isometric view depicting two adjacent pixels in a series of pixels of a visual display, wherein each pixel comprises a MEMS interferometric modulator. In some embodiments, an interferometric modulator display comprises a row/column array of these interferometric modulators. Each interferometric modulator includes a pair of reflective layers positioned at a variable and controllable distance from each other to form a resonant optical cavity with at least one variable dimension. In one embodiment, one of the reflective layers may be moved between two positions. In the first position, referred to herein as the relaxed, the movable layer is positioned at a relatively large distance from a fixed partially reflective layer. In the second position, the movable layer is positioned more closely adjacent to the partially reflective layer. Incident light that reflects from the two layers interferes constructively or destructively depending on the position of the movable reflective layer, producing either an overall reflective or non-reflective state for each pixel.

The depicted portion of the pixel array in FIG. 1 includes two adjacent interferometric modulators 12a and 12b. In the interferometric modulator 12a on the left, a movable and highly reflective layer 14a is illustrated in a relaxed position at a predetermined distance from a fixed partially reflective layer 16a. In the interferometric modulator 12b on the right, the movable highly reflective layer 14b is illustrated in an actuated position adjacent to the fixed partially reflective layer 16b.

The fixed layers 16a, 16b are electrically conductive, partially transparent and partially reflective, and may be fabricated, for example, by depositing one or more layers each of chromium and indium-tin-oxide onto a transparent substrate 20. The layers are patterned into parallel strips, and may form row electrodes in a display device as described further below. The movable layers 14a, 14b may be formed as a series of parallel strips of a deposited metal layer or layers (orthogonal to the row electrodes 16a, 16b) deposited on top of posts 18 and an intervening sacrificial material deposited between the posts 18. When the sacrificial material is etched away, the deformable metal layers 14a, 14b are separated from the fixed metal layers by a defined gap 19. A highly conductive and reflective material such as aluminum may be used for the deformable layers, and these strips may form column electrodes in a display device.

With no applied voltage, the cavity 19 remains between the layers 14a, 16a and the deformable layer is in a mechanically relaxed state as illustrated by the pixel 12a in FIG. 1. However, when a potential difference is applied to a selected row and column, the capacitor formed at the intersection of the row and column electrodes at the corresponding pixel becomes charged, and electrostatic forces pull the electrodes together. If the voltage is high enough, the movable layer is deformed and is forced against the fixed layer (a dielectric material which is not illustrated in this Figure may be deposited on the fixed layer to prevent shorting and control the separation distance) as illustrated by the pixel 12b on the right in FIG. 1. The behavior is the same regardless of the polarity of the applied potential difference. In this way, row/column actuation that can control the reflective vs. non-reflective pixel states is analogous in many ways to that used in conventional LCD and other display technologies.

FIGS. 2 through 5 illustrate one exemplary process and system for using an array of interferometric modulators in a display application.

Figure 2:
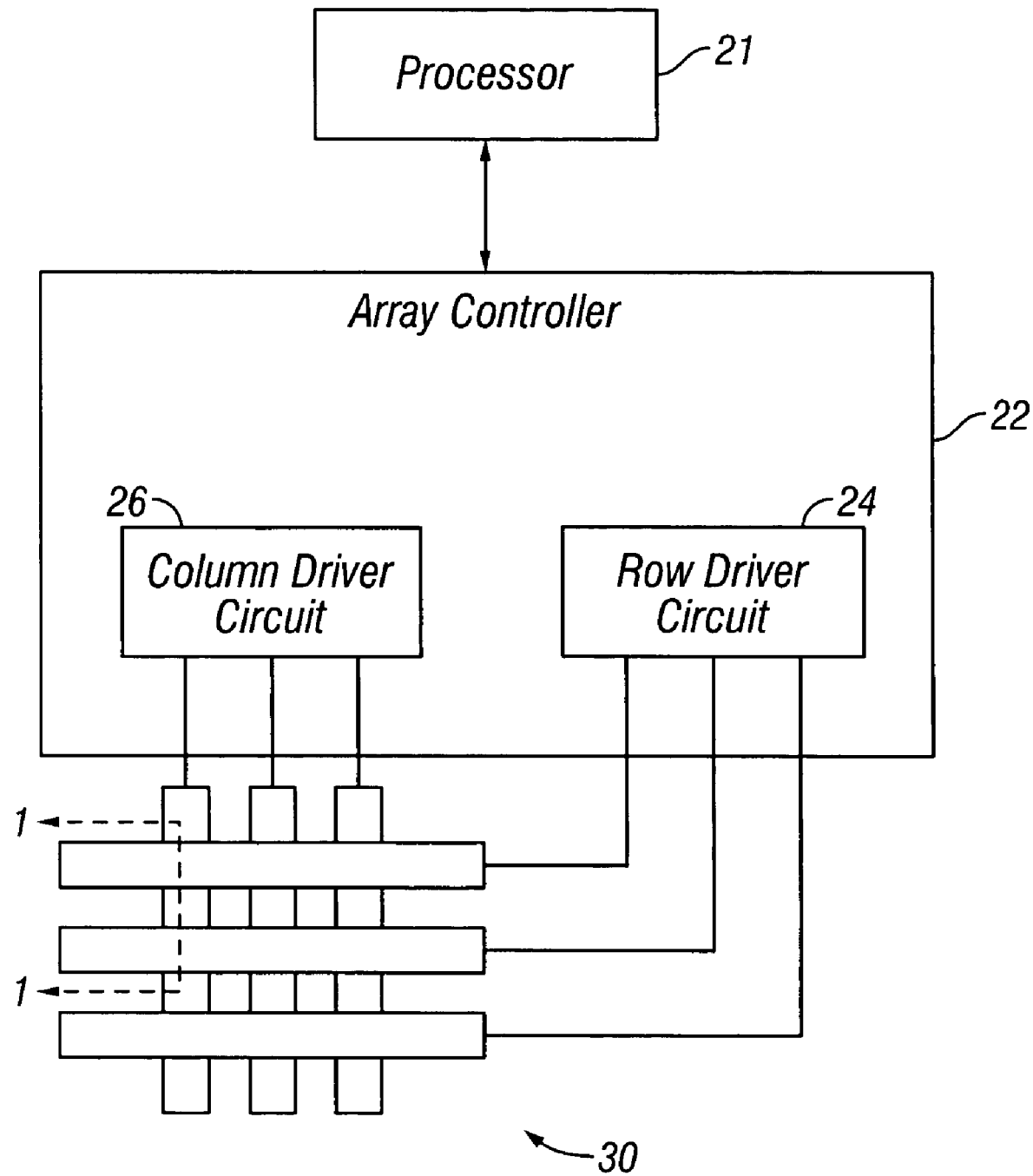
FIG. 2 is a system block diagram illustrating one embodiment of an electronic device incorporating a 3×3 interferometric modulator display.

FIG. 2 is a system block diagram illustrating one embodiment of an electronic device that may incorporate aspects of the invention. In the exemplary embodiment, the electronic device includes a processor 21 which may be any general purpose single- or multi-chip microprocessor such as an ARM, Pentium®, Pentium II®, Pentium III®, Pentium IV®, Pentium® Pro, an 8051, a MIPS®, a Power PC®, an ALPHA®, or any special purpose microprocessor such as a digital signal processor, microcontroller, or a programmable gate array. As is conventional in the art, the processor 21 may be configured to execute one or more software modules. In addition to executing an operating system, the processor may be configured to execute one or more software applications, including a web browser, a telephone application, an email program, or any other software application.

In one embodiment, the processor 21 is also configured to communicate with an array controller 22. In one embodiment, the array controller 22 includes a row driver circuit 24 and a column driver circuit 26 that provide signals to a display array or panel 30. The cross section of the array illustrated in FIG. 1 is shown by the lines 1-1 in FIG. 2. For MEMS interferometric modulators, the row/column actuation protocol may take advantage of a hysteresis property of these devices illustrated in FIG. 3. It may require, for example, a 10 volt potential difference to cause a movable layer to deform from the relaxed state to the actuated state. However, when the voltage is reduced from that value, the movable layer maintains its state as the voltage drops back below 10 volts. In the exemplary embodiment of FIG. 3, the movable layer does not relax completely until the voltage drops below 2 volts. There is thus a range of voltage, about 3 to 7 V in the example illustrated in FIG. 3, where there exists a window of applied voltage within which the device is stable in either the relaxed or actuated state. This is referred to herein as the "hysteresis window" or "stability window." For a display array having the hysteresis characteristics of FIG. 3, the row/column actuation protocol can be designed such that during row strobing, pixels in the strobed row that are to be actuated are exposed to a voltage difference of about 10 volts, and pixels that are to be relaxed are exposed to a voltage difference of close to zero volts. After the strobe, the pixels are exposed to a steady state voltage difference of about 5 volts such that they remain in whatever state the row strobe put them in. After being written, each pixel sees a potential difference within the "stability window" of 3-7 volts in this example. This feature makes the pixel design illustrated in FIG. 1 stable under the same applied voltage conditions in either an actuated or relaxed pre-existing state. Since each pixel of the interferometric modulator, whether in the actuated or relaxed state, is essentially a capacitor formed by the fixed and moving reflective layers, this stable state can be held at a voltage within the hysteresis window with almost no power dissipation. Essentially no current flows into the pixel if the applied potential is fixed.

In typical applications, a display frame may be created by asserting the set of column electrodes in accordance with the desired set of actuated pixels in the first row. A row pulse is then applied to the row 1 electrode, actuating the pixels corresponding to the asserted column lines. The asserted set of column electrodes is then changed to correspond to the desired set of actuated pixels in the second row. A pulse is then applied to the row 2 electrode, actuating the appropriate pixels in row 2 in accordance with the asserted column electrodes. The row 1 pixels are unaffected by the row 2 pulse, and remain in the state they were set to during the row 1 pulse. This may be repeated for the entire series of rows in a sequential fashion to produce the frame. Generally, the frames are refreshed and/or updated with new display data by continually repeating this process at some desired number of frames per second. A wide variety of protocols for driving row and column electrodes of pixel arrays to produce display frames are also well known and may be used in conjunction with the present invention.

Figures 3, 4:
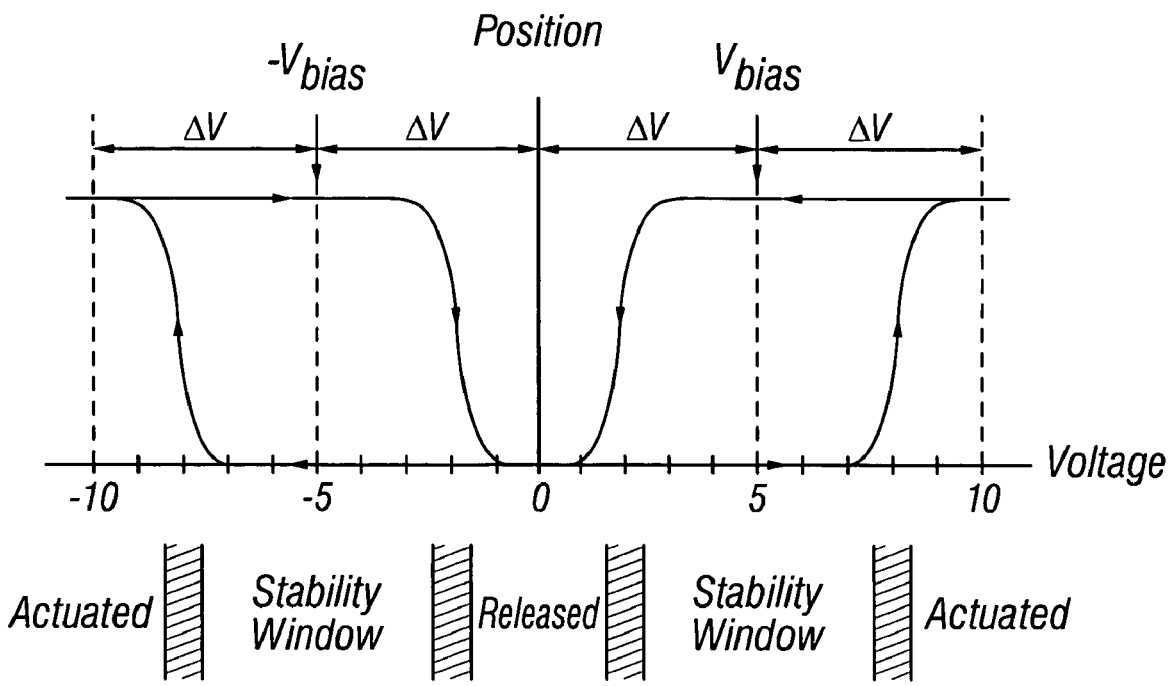
FIG. 3 is a diagram of movable mirror position versus applied voltage for one exemplary embodiment of an interferometric modulator of FIG. 1.
FIG. 4 is an illustration of a set of row and column voltages that may be used to drive an interferometric modulator display.

FIGS. 4 and 5 illustrate one possible actuation protocol for creating a display frame on the 3×3 array of FIG. 2. FIG. 4 illustrates a possible set of column and row voltage levels that may be used for pixels exhibiting the hysteresis curves of FIG. 3. In the FIG. 4 embodiment, actuating a pixel involves setting the appropriate column to $-V_{bias}$, and the appropriate row to $+\Delta V$, which may correspond to $-5$ volts and $+5$ volts respectively Relaxing the pixel is accomplished by setting the appropriate column to $+V_{bias}$, and the appropriate row to the same $+\Delta V$, producing a zero volt potential difference across the pixel. In those rows where the row voltage is held at zero volts, the pixels are stable in whatever state they were originally in, regardless of whether the column is at $+V_{bias}$, or $-V_{bias}$. As is also illustrated in FIG. 4, it will be appreciated that voltages of opposite polarity than those described above can be used, e.g., actuating a pixel can involve setting the appropriate column to $+V_{bias}$, and the appropriate row to $-\Delta V$. In this embodiment, releasing the pixel is accomplished by setting the appropriate column to $-V_{bias}$, and the appropriate row to the same $-\Delta V$, producing a zero volt potential difference across the pixel.

Figure 5A:
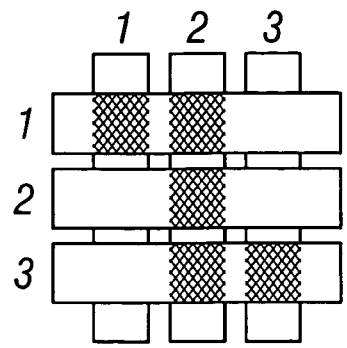
FIGS. 5A and 5B illustrate one exemplary timing diagram for row and column signals that may be used to write a frame of display data to the 3×3 interferometric modulator display of FIG. 2.
Figure 5B:
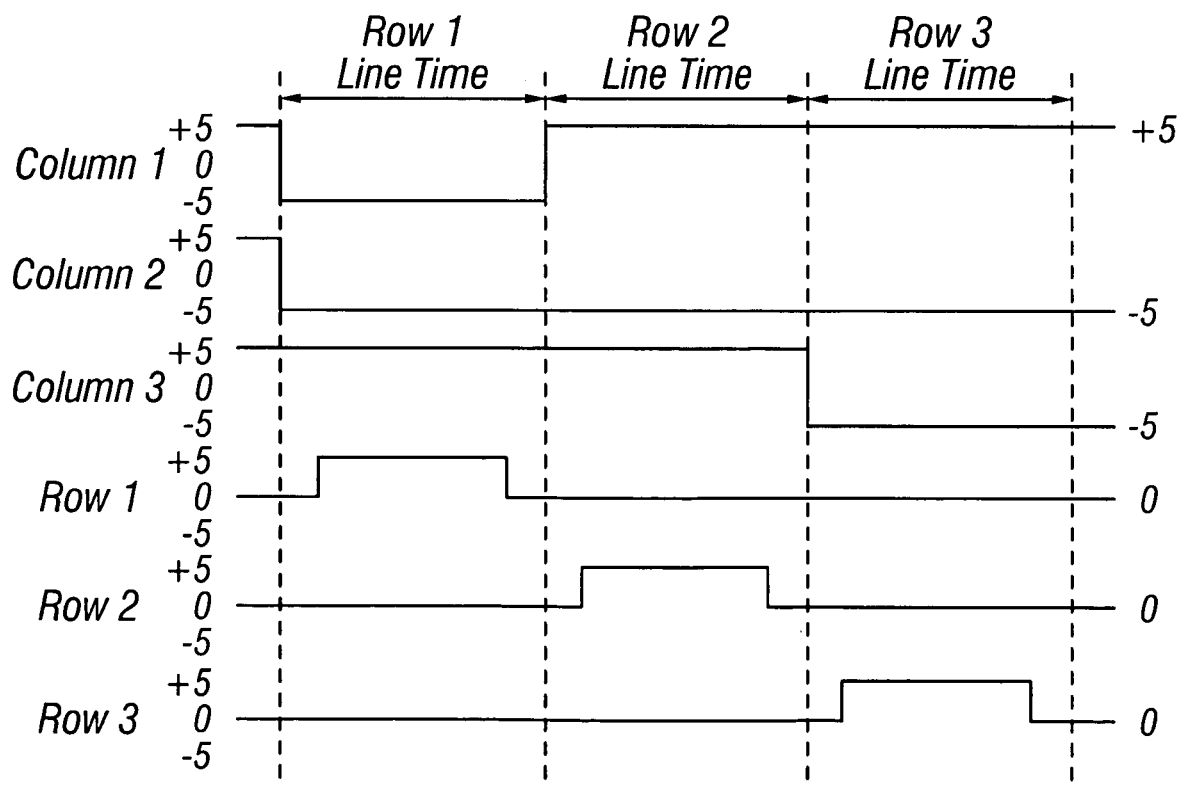

FIG. 5B is a timing diagram showing a series of row and column signals applied to the 3×3 array of FIG. 2 which will result in the display arrangement illustrated in FIG. 5A, where actuated pixels are non-reflective. Prior to writing the frame illustrated in FIG. 5A, the pixels can be in any state, and in this example, all the rows are at 0 volts, and all the columns are at +5 volts. With these applied voltages, all pixels are stable in their existing actuated or relaxed states.

In the FIG. 5A frame, pixels (1,1), (1,2), (2,2), (3,2) and (3,3) are actuated. To accomplish this, during a "line time" for row 1, columns 1 and 2 are set to −5 volts, and column 3 is set to +5 volts. This does not change the state of any pixels, because all the pixels remain in the 3-7 volt stability window. Row 1 is then strobed with a pulse that goes from 0, up to 5 volts, and back to zero. This actuates the (1,1) and (1,2) pixels and relaxes the (1,3) pixel. No other pixels in the array are affected. To set row 2 as desired, column 2 is set to −5 volts, and columns 1 and 3 are set to +5 volts. The same strobe applied to row 2 will then actuate pixel (2,2) and relax pixels (2,1) and (2,3). Again, no other pixels of the array are affected. Row 3 is similarly set by setting columns 2 and 3 to −5 volts, and column 1 to +5 volts. The row 3 strobe sets the row 3 pixels as shown in FIG. 5A. After writing the frame, the row potentials are zero, and the column potentials can remain at either +5 or −5 volts, and the display is then stable in the arrangement of FIG. 5A. It will be appreciated that the same procedure can be employed for arrays of dozens or hundreds of rows and columns. It will also be appreciated that the timing, sequence, and levels of voltages used to perform row and column actuation can be varied widely within the general principles outlined above, and the above example is exemplary only, and any actuation voltage method can be used with the systems and methods described herein.

Figure 6A:
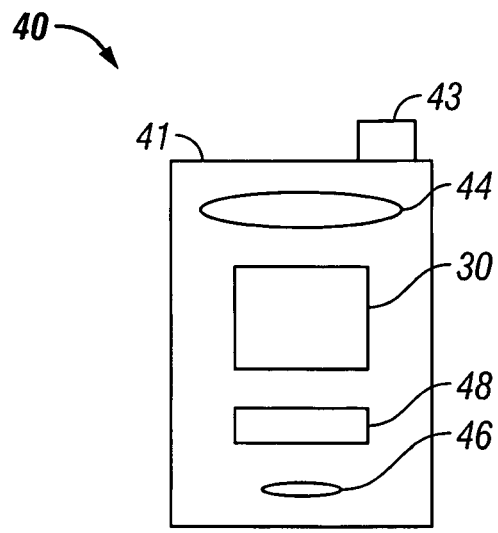
FIGS. 6A and 6B are system block diagrams illustrating an embodiment of a display device.
Figure 6B:
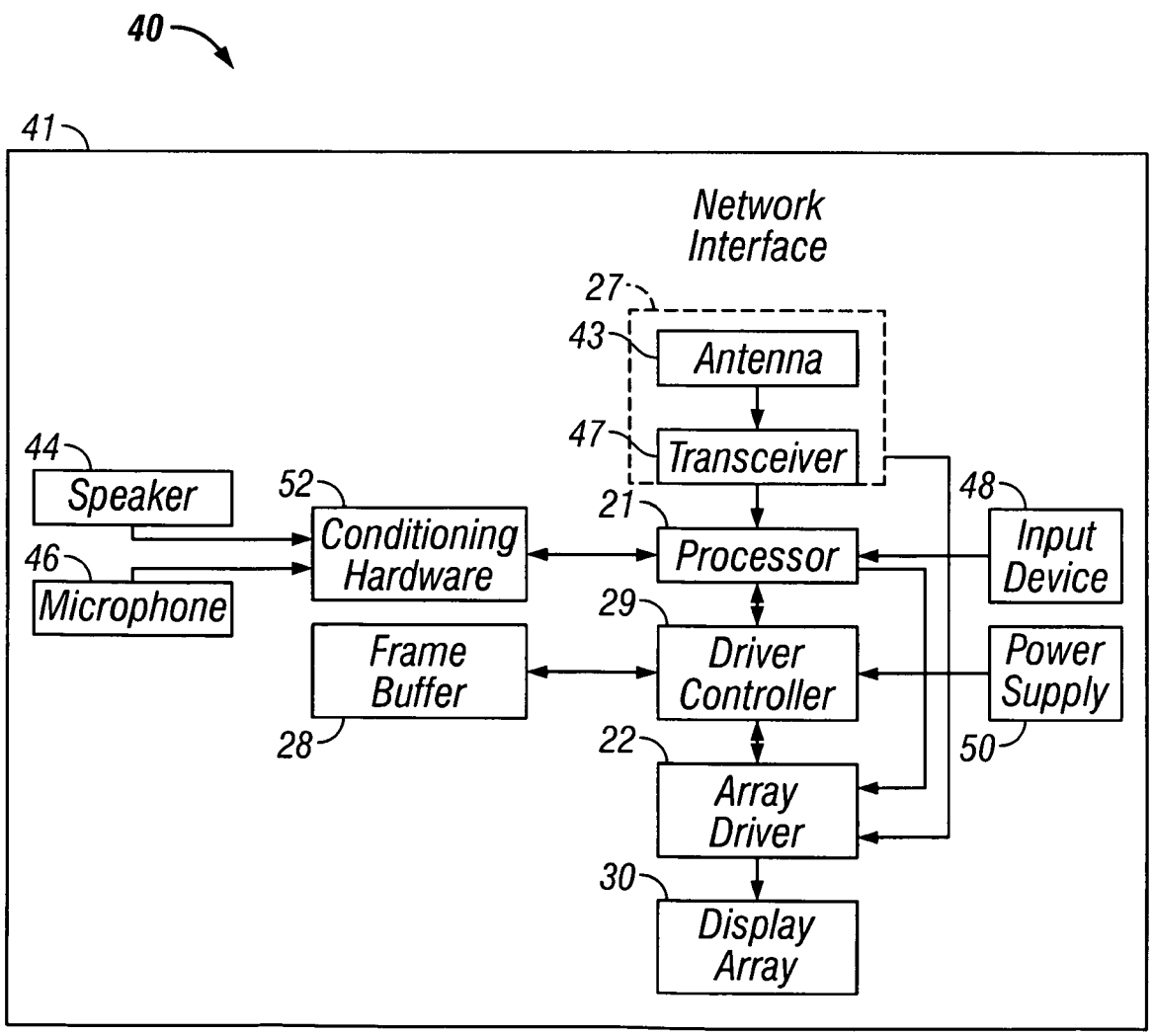

FIGS. 6A and 6B are system block diagrams illustrating an embodiment of a display device 40. The display device 40 can be, for example, a cellular or mobile telephone. However, the same components of display device 40 or slight variations thereof are also illustrative of various types of display devices such as televisions and portable media players.

The display device 40 includes a housing 41, a display 30, an antenna 43, a speaker 44, an input device 48, and a microphone 46. The housing 41 is generally formed from any of a variety of manufacturing processes as are well known to those of skill in the art, including injection molding, and vacuum forming. In addition, the housing 41 may be made from any of a variety of materials, including but not limited to plastic, metal, glass, rubber, and ceramic, or a combination thereof. In one embodiment the housing 41 includes removable portions (not shown) that may be interchanged with other removable portions of different color, or containing different logos, pictures, or symbols.

The display 30 of exemplary display device 40 may be any of a variety of displays, including a bi-stable display, as described herein. In other embodiments, the display 30 includes a flat-panel display, such as plasma, EL, OLED, STN LCD, or TFT LCD as described above, or a non-flat-panel display, such as a CRT or other tube device, as is well known to those of skill in the art. However, for purposes of describing the present embodiment, the display 30 includes an interferometric modulator display, as described herein.

The components of one embodiment of exemplary display device 40 are schematically illustrated in FIG. 6B. The illustrated exemplary display device 40 includes a housing 41 and can include additional components at least partially enclosed therein. For example, in one embodiment, the exemplary display device 40 includes a network interface 27 that includes an antenna 43 which is coupled to a transceiver 47. The transceiver 47 is connected to a processor 21, which is connected to conditioning hardware 52. The conditioning hardware 52 may be configured to condition a signal (e.g. filter a signal). The conditioning hardware 52 is connected to a speaker 44 and a microphone 46. The processor 21 is also connected to an input device 48 and a driver controller 29. The driver controller 29 is coupled to a frame buffer 28, and to an array driver 22, which in turn is coupled to a display array 30. A power supply 50 provides power to all components as required by the particular exemplary display device 40 design.

The network interface 27 includes the antenna 43 and the transceiver 47 so that the exemplary display device 40 can communicate with one ore more devices over a network. In one embodiment the network interface 27 may also have some processing capabilities to relieve requirements of the processor 21. The antenna 43 is any antenna known to those of skill in the art for transmitting and receiving signals. In one embodiment, the antenna transmits and receives RF signals according to the IEEE 802.11 standard, including IEEE 802.11(a), (b), or (g). In another embodiment, the antenna transmits and receives RF signals according to the BLUETOOTH standard. In the case of a cellular telephone, the antenna is designed to receive CDMA, GSM, AMPS or other known signals that are used to communicate within a wireless cell phone network. The transceiver 47 pre-processes the signals received from the antenna 43 so that they may be received by and further manipulated by the processor 21. The transceiver 47 also processes signals received from the processor 21 so that they may be transmitted from the exemplary display device 40 via the antenna 43.

In an alternative embodiment, the transceiver 47 can be replaced by a receiver. In yet another alternative embodiment, network interface 27 can be replaced by an image source, which can store or generate image data to be sent to the processor 21. For example, the image source can be a digital video disc (DVD) or a hard-disc drive that contains image data, or a software module that generates image data.

Processor 21 generally controls the overall operation of the exemplary display device 40. The processor 21 receives data, such as compressed image data from the network interface 27 or an image source, and processes the data into raw image data or into a format that is readily processed into raw image data. The processor 21 then sends the processed data to the driver controller 29 or to frame buffer 28 for storage. Raw data typically refers to the information that identifies the image characteristics at each location within an image. For example, such image characteristics can include color, saturation, and gray-scale level.

In one embodiment, the processor 21 includes a microcontroller, CPU, or logic unit to control operation of the exemplary display device 40. Conditioning hardware 52 generally includes amplifiers and filters for transmitting signals to the speaker 44, and for receiving signals from the microphone 46. Conditioning hardware 52 may be discrete components within the exemplary display device 40, or may be incorporated within the processor 21 or other components.

The driver controller 29 takes the raw image data generated by the processor 21 either directly from the processor 21 or from the frame buffer 28 and reformats the raw image data appropriately for high speed transmission to the array driver 22. Specifically, the driver controller 29 reformats the raw image data into a data flow having a raster-like format, such that it has a time order suitable for scanning across the display array 30. Then the driver controller 29 sends the formatted information to the array driver 22. Although a driver controller 29, such as a LCD controller, is often associated with the system processor 21 as a stand-alone Integrated Circuit (IC), such controllers may be implemented in many ways. They may be embedded in the processor 21 as hardware, embedded in the processor 21 as software, or fully integrated in hardware with the array driver 22.

Typically, the array driver 22 receives the formatted information from the driver controller 29 and reformats the video data into a parallel set of waveforms that are applied many times per second to the hundreds and sometimes thousands of leads coming from the display's x-y matrix of pixels.

In one embodiment, the driver controller 29, array driver 22, and display array 30 are appropriate for any of the types of displays described herein. For example, in one embodiment, driver controller 29 is a conventional display controller or a bi-stable display controller (e.g., an interferometric modulator controller). In another embodiment, array driver 22 is a conventional driver or a bi-stable display driver (e.g., an interferometric modulator display). In one embodiment, a driver controller 29 is integrated with the array driver 22. Such an embodiment is common in highly integrated systems such as cellular phones, watches, and other small area displays. In yet another embodiment, display array 30 is a typical display array or a bi-stable display array (e.g., a display including an array of interferometric modulators).

The input device 48 allows a user to control the operation of the exemplary display device 40. In one embodiment, input device 48 includes a keypad, such as a QWERTY keyboard or a telephone keypad, a button, a switch, a touch-sensitive screen, a pressure- or heat-sensitive membrane. In one embodiment, the microphone 46 is an input device for the exemplary display device 40. When the microphone 46 is used to input data to the device, voice commands may be provided by a user for controlling operations of the exemplary display device 40.

Power supply 50 can include a variety of energy storage devices as are well known in the art. For example, in one embodiment, power supply 50 is a rechargeable battery, such as a nickel-cadmium battery or a lithium ion battery. In another embodiment, power supply 50 is a renewable energy source, a capacitor, or a solar cell, including a plastic solar cell, and solar-cell paint. In another embodiment, power supply 50 is configured to receive power from a wall outlet.

In some implementations control programmability resides, as described above, in a driver controller which can be located in several places in the electronic display system. In some cases control programmability resides in the array driver 22. Those of skill in the art will recognize that the above-described optimization may be implemented in any number of hardware and/or software components and in various configurations.

Figure 7A:
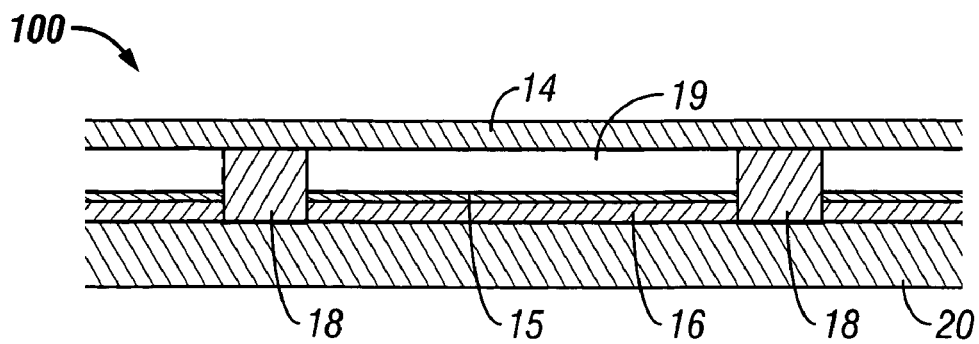
FIG. 7A is a cross section of the device of FIG. 1.
Figure 7B:
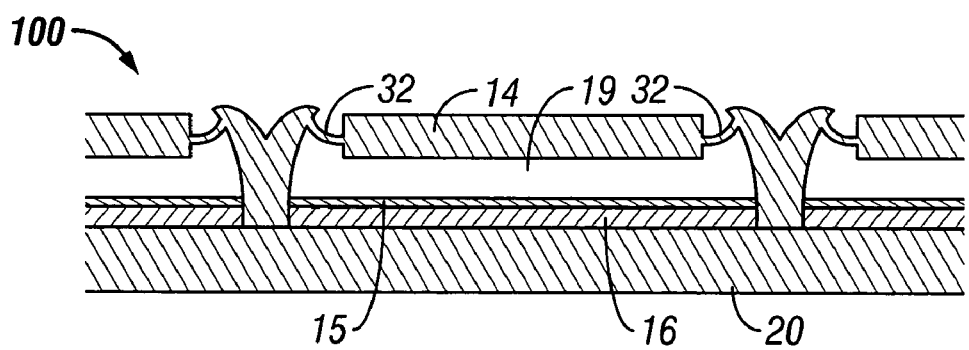
FIG. 7B is a cross section of an alternative embodiment of an interferometric modulator.
Figure 7C:
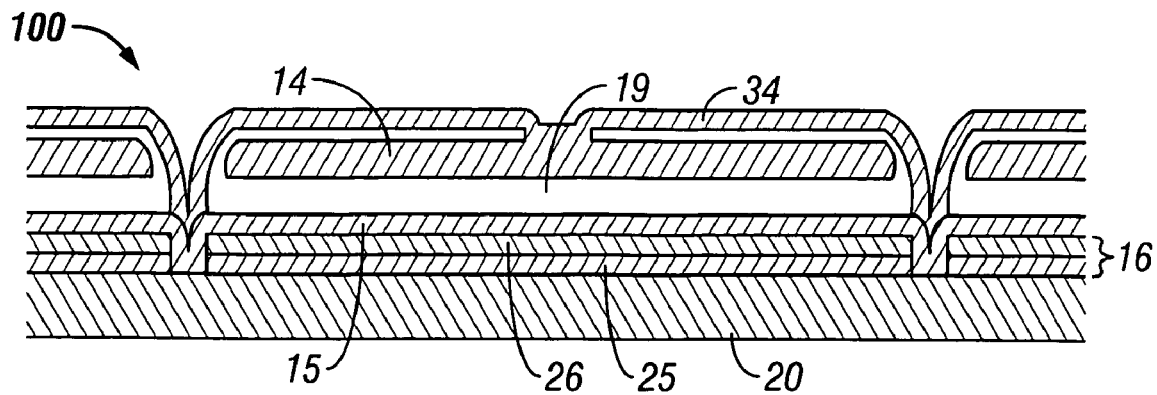
FIG. 7C is a cross section of another alternative embodiment of an interferometric modulator.

The details of the structure of interferometric modulators that operate in accordance with the principles set forth above may vary widely. For example, FIGS. 7A-7C illustrate three different embodiments of the moving mirror structure. FIG. 7A is a cross section of the embodiment of FIG. 1, where a strip of metal material 14 is deposited on orthogonally extending supports 18. In FIG. 7B, the moveable reflective material 14 is attached to supports at the corners only, on tethers 32. In FIG. 7C, the moveable reflective material 14 is suspended from a deformable layer 34. This embodiment has benefits because the structural design and materials used for the reflective material 14 can be optimized with respect to the optical properties, and the structural design and materials used for the deformable layer 34 can be optimized with respect to desired mechanical properties. The production of various types of interferometric devices is described in a variety of published documents, including, for example, U.S. Published Application 2004/0051929. A wide variety of known techniques may be used to produce the above described structures involving a series of material deposition, patterning, and etching steps.

FIGS. 7A-C also illustrate the use of an insulating layer 15 disposed between the moveable reflective material 14 and the fixed partially reflective layer 16. In these embodiments, the fixed partially reflective layer 16 is formed above the transparent substrate 20. The insulating material 15 is then formed above the fixed partially reflective layer 16.

As depicted in FIG. 7C, the fixed partially reflective layer 16 typically comprises several sublayers. For example, the fixed partially reflective layer 16 of FIG. 7C has an electrode sublayer 25 formed above the transparent substrate 20. The electrode sublayer 25 may be formed out of an appropriate conductive material that is also at least partially transmissive to light, such as indium tin oxide (ITO). A partially reflective sublayer 26, typically made of a metal material such as chrome, is then formed above the electrode layer 25. The partially reflective sublayer 26 acts as an optical component that is at least partially reflective to light. The viewing surface of the transparent substrate 20 is at the bottom of the substrate 20, which is the opposite side of the substrate 20 than that upon which the electrode sublayer 25 and partially reflective sublayer 26 are formed. Through processes such as patterning and etching, the electrode sublayer 25 and partially reflective sublayer 26 may form electrode columns, rows or other useful shapes as required by the display design.

FIGS. 7A-C are only illustrative of the number of layers that may be within the interferometric modulator 100. For example, a sacrificial material (not shown) may be formed between any of the layers or sublayers depicted in FIGS. 7A-C. Other layers or sublayers may also be incorporated into the interferometric modulator 100. For example, additional electrode layers, reflective layers, transmissive layers, light absorbing layers, or insulating layers may be used. In one embodiment, the movable reflective layer 14 comprises several sublayers, including an electrode layer disposed above a highly reflective material. Other embodiments may have an electrode as a deformable layer, such as deformable layer 34 in FIG. 7C, which may be disposed above the movable reflective layer 14. The layers and sublayers within the interferometric modulator 100 may be formed using standard deposition techniques, e.g., sputtering, and standard photolithographic techniques.

As used herein, the terms layer or sublayer are to be given their broadest ordinary meaning. Moreover, a layer or sublayer may comprise several additional sublayers and are not limited to homogeneous substances of a thin uniform thickness. For example, the insulating layer 15 may or may not have a uniform thickness, may or may not be formed of a single material, and may or may not be relatively thin. Although many of the layers or sublayers in FIGS. 7A-C are depicted as having a relatively thin sheetlike expanse or region lying over or under another, a layer or sublayer as used herein may comprise a shorter expanse or region or multiple expanses or regions. For example, the insulating layer 15 may comprise one or more shorter segments that do not expand the entire region of the fixed partially reflective layer 16.

Referring to FIGS. 7A-C, the insulating material 15 is disposed within the interferometric modulating device 100. As used herein, the term insulating material is to be given its broadest ordinary meaning, including but not limited to a material that holds an electrostatic charge and resists current flow. Examples of such an insulating material include, but are not limited to, dielectric materials. The insulating material 15 may also be formed from ferroelectric materials, which typically have high dielectric constants. The insulating material 15 may be formed of, but is not limited to, silicon-rich oxide (for example $SiO_x$ where x is less than 2, semi-insulating polycrystalline silicon (SIPOS), silicon oxide (which includes $SiO_2$), silicon nitride, silicon nitride, nitrided silicon oxide, titanium oxide (which includes TiO and $TiO_2$), and oxy-nitride. In other embodiments, the insulating material 15 is made of a material that has a high dielectric constant (which is classified as having a dielectric constant higher than silicon nitride) and is capable of being polarized.

An interface between two different dielectric or insulating materials typically creates trapping sites, and thus forms a preferred structure for inducing and retaining polarization. Referring to FIGS. 8A-G, the insulating material 15 may be formed of several sublayers having an interface 51 between any two of the sublayers. The sublayers may be formed by a continuous ultra-dry (CUD) process, a sputtering process, or other standard deposition and/or photolithographic techniques. FIG. 8A illustrates the insulating material 15 having a sublayer of silicon oxide 53 below a sublayer of silicon nitride 52. A stack having a silicon-nitride 52 sublayer and a silicon oxide 53 sublayer has shown an enhanced capacity of holding a fixed amount of charge in metal-insulator-silicon memory device (MNOS). It is thus a preferred material for creating polarization. The induced charge in the insulating material 15 is further enhanced and stabilized by the charges at the interface 51 of the silicon-nitride 52 and silicon oxide 53 sublayers.

In a similar structure illustrated in FIG. 8B, the silicon-oxide sublayer may be replaced by a silicon-rich oxide 55 sublayer such as SIPOS. SIPOS has a demonstrated capacity for holding an induced charge in a high voltage lateral double-diffused metal-oxide semiconductor (LDMOS). Placing a silicon nitride 54 sublayer above the SIPOS 55 sublayer helps stabilize the induced charge held by the insulating material 15. This stabilization is provided in part by the interface 51 of the silicon nitride 54 and the SIPOS 55 sublayers. FIG. 8C illustrates another such insulating material 15 having a sublayer of silicon-rich oxide 57 below a sublayer of nitrided silicon oxide 56.

A variation of FIG. 8A is illustrated in FIG. 8D, wherein the insulating material 15 has a sublayer of silicon nitride 59 below a sublayer of oxy-nitride 58. The oxy-nitride 58 is a thin layer of silicon-oxide converted from silicon-nitride in an oxygen ambient environment. Such a structure is similar to an inverted stack of FIG. 8A, and is expected to show an enhanced capacity for holding induced polarization.

FIG. 8E illustrates the insulating material 15 having a sublayer of silicon oxide 61 below a sublayer of silicon-rich oxide 60, and is a variation of FIG. 8C. FIG. 8F illustrates the insulating material 15 having a sublayer of silicon oxide 62 that is formed by CUD above another sublayer of silicon oxide 63 that is formed by sputtering. Such a structure comprises two layers of oxide formed by different processes which contain different microstructures. Such a difference in microstructure then creates an interface 51 and a region for holding trapped charges from an induced polarization. FIG. 8G illustrates the insulating material 15 having a sublayer of silicon oxide 65 below a sublayer of titanium oxide 64. This embodiment utilizes the high dielectric constant of titanium oxide and its associated capacity of polarization to hold trapped charges from an induced polarization.

Figure 9:
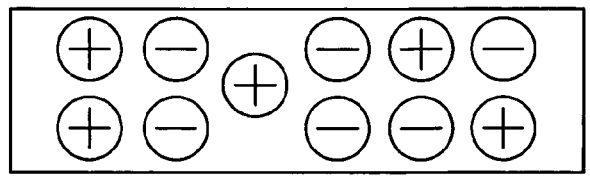
FIG. 9 is a cross section of an embodiment of an insulating layer having a random charge distribution.

Referring to FIG. 9, the insulating material 15 will typically have a substantially random charge distribution. With a substantially random charge distribution, there typically is a net-zero electric field or a net-zero internal dipole moment. This random charge distribution may produce undesirable effects within an interferometric modulator, such as an uncontrolled shift of charge during operation of the device.

Figure 10:
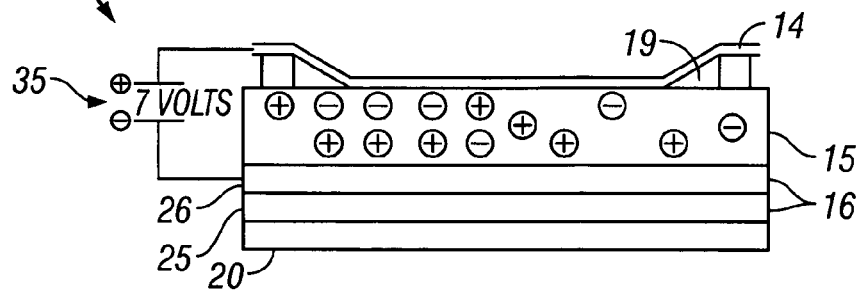
FIG. 10 is a cross section of an embodiment of an interferometric modulator having an insulating layer with a random charge distribution.

Referring to FIG. 10, an actuation voltage is supplied by a voltage source 35 to an interferometric modulating device 100. The actuation voltage is applied to the movable reflective layer 14 and the electrode sublayer 26 of the fixed partially reflective layer 16. As used herein, the term actuation voltage refers to a voltage necessary to move the movable reflective layer 14 towards the fixed partially reflective layer 16, thereby collapsing the optical cavity 19. Although the voltage source 35 is depicted as a capacitor in FIG. 10, any suitable voltage source may be used to supply the actuation voltage.

As depicted in FIG. 10, the movable reflective layer 14 is drawn towards the fixed partially reflective layer 16 upon application of the actuation voltage, collapsing the optical cavity 19. When a potential difference is applied to the movable reflective layer 14 and fixed partially reflective layer 16, a capacitor is formed between these two layers, which creates electrostatic forces that pull the moveable reflective layer 14 towards the fixed partially reflective layer 16, thereby collapsing the optical cavity 19. If the actuation voltage is high enough, the movable reflective layer 14 may be deformed and forced against the insulating layer 15, which is disposed above the fixed partially reflective layer 16. When no potential difference is applied, however, the mechanical restoration forces of the moveable reflective layer 14 and its surrounding structure may return the moveable reflective layer 14 to its original position, thereby restoring the optical cavity 19. The mechanical restoration forces of the moveable reflective layer 14 should therefore be carefully balanced with the electrostatic forces created between the movable reflective layer 14 and the fixed partially reflective layer 16 in order to ensure proper operation and responsiveness of the interferometric light modulating device 100.

Figure 11:
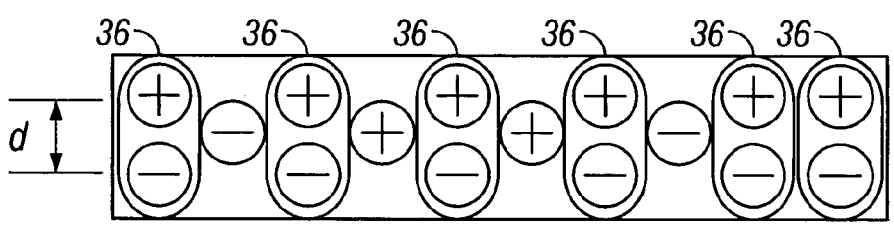
FIG. 11 is a cross section of an embodiment of an insulating layer having a random charge distribution with some temporarily aligned dipoles.

With a substantially random distribution of charge within the insulating layer 15, the charges within the interferometric modulator may move in undesirable ways. Referring to FIGS. 10 and 11 for example, even though the substantially random distribution of charge creates a net-zero electric field, if some of the random charges within the insulating layer 15 happen to align and form electric dipole moments, such as those temporarily aligned charges 36 in FIG. 11 that are separated by a distance (d), then a portion of the actuation voltage necessary to collapse or release the optical cavity 19 may be undesirably supplied by the temporarily aligned charges 36. This is because the temporarily aligned charges 36 within the insulating layer 15 may form an electric field (E) and act as an internal battery. During the operation of the interferometric modulator 100, an uncontrolled alignment of charges 36 in a certain direction and random formation of dipole moments, temporal or permanent, may occur, resulting in a deviation of operating voltage from the initial net neutral distribution condition. As used herein, the term operating voltage refers to the voltage supplied to the interferometric modulator 100. As a result of the uncontrolled alignment of charges 36, an additional uncontrolled voltage may be supplied by the insulating layer 15 to the interferometric modulator 100, where the difference in the operating voltage ($\Delta V$) may correspond to the equation $\Delta V = Ed$.

It is thus desirable to create a more predictable internal dipole moment within the insulating layer 15 such that the operating voltage will remain substantially constant. Thus, the operating voltage may be predetermined, thereby substantially avoiding an uncontrolled change in the operating voltage. By substantially fixing and aligning the random charge distribution within the insulating layer 15, an uncontrolled shift of charge within the insulating layer 15 may be substantially avoided. Moreover, a portion of the actuation voltage necessary to collapse or release the optical cavity 19 may be predictably supplied by providing an amount corresponding to the electric field that is created by substantially fixing and aligning the charges within the insulating layer 15, thereby creating internal dipole moments that may act as a battery to help drive the interferometric modulating device 100. Furthermore, by aligning and affixing random charges in a designated direction, the driving waveform for operating the interferometric modulator device 100 may also be simplified. Use of a single polarity of driving pulses may be a possible option for substantially fixing and aligning the charges, since the fixed polarity will not create shifting in the charges. Thus, shifting charges will no longer be a problem in a prolonged operation of the device 100.

Figure 12:
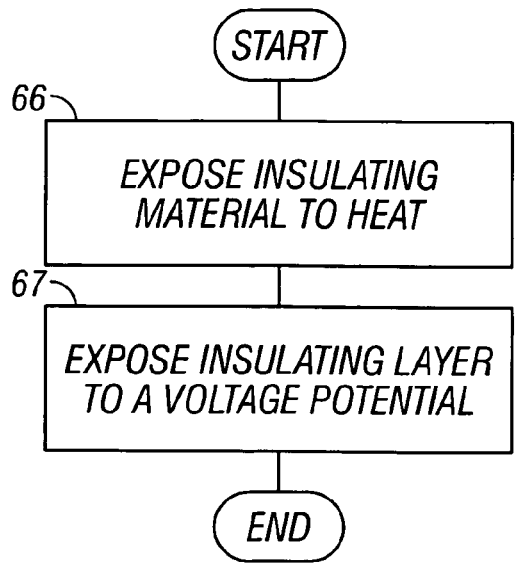
FIG. 12 is a flow chart of a method of inducing an internal dipole moment within an insulating layer according to one embodiment of the invention.

FIG. 12 is a flowchart describing a method used to induce an internal dipole moment within an insulating material. The method starts by exposing the insulating material to heat at step 66. Exposure to heat will speed up the process that aligns and fixes the random charges within the insulating material. It is well known that an increase in temperature will cause reactions to occur faster. This is because the higher temperature will lower the amount of activation energy necessary to start or complete a reaction. For example, performing this method at 50 degrees Celsius may make the reaction occur approximately three times faster than performing this method at room temperature (22 degrees Celsius). Similarly, performing this method at 70 degrees Celsius may make the reaction occur approximately three times faster than performing this method at 50 degrees Celsius. Once the insulating material is exposed to heat, the random charge distribution within the insulating material may be substantially aligned and fixed by applying a voltage potential (V) to the insulating material at step 67. Although not necessary, this voltage potential (V) may be of a greater magnitude than the normal actuation voltage necessary to operate an interferometric modulating device. For example, referring to FIG. 10, the voltage potential (V) may be of a greater magnitude than the actuation voltage applied by the voltage source 35 to substantially collapse the optical cavity 19 of the interferometric modulator 100. Increasing the amount of voltage potential exposed to the insulating material will lessen the amount of time necessary to substantially align and fix the charges within the insulating material. The method then ends after step 67. The method of FIG. 12 is not limited to steps 66 and 67 and is not limited to any particular order. For example, the insulating material may be exposed to the voltage potential prior to the heating step. Moreover, to help ensure that the charges are substantially fixed and aligned, the insulating material may be cooled back to room temperature while still being exposed to the voltage potential.

Figure 13:
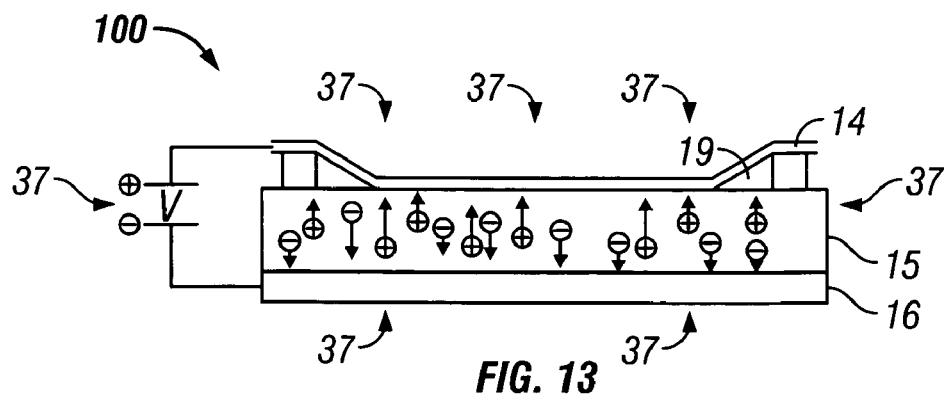
FIG. 13 is a cross section of an embodiment of an interferometric modulator having an insulating layer exposed to heat and a voltage potential.

The method of FIG. 12 will now be discussed with reference to FIGS. 13 and 14. Referring to FIG. 13, the insulating layer 15 is exposed to heat 37 in order to increase the temperature of the insulating layer 15. Once the insulating layer 15 is exposed to heat, the random charge distribution within the insulating layer 15 is substantially aligned and fixed by applying a voltage potential (V) between the electrodes within the movable reflective layer 14 and the fixed partially reflective layer 16. Again, this voltage potential (V) may be of a greater magnitude than the normal actuation voltage necessary to pull the movable reflective layer 14 towards the fixed partially reflective layer 16 and substantially collapse the optical cavity 19.

Figure 14:
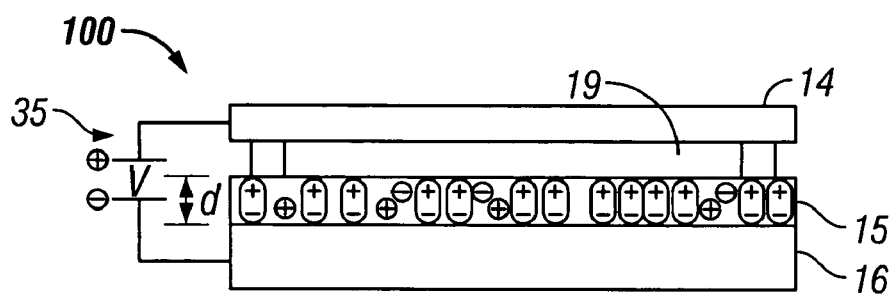
FIG. 14 is a cross section of an embodiment of an interferometric modulator having an insulating layer with an induced dipole moment.

After a sufficient amount of time of being exposed to heat 37 and voltage potential (V), the random charges within the insulating layer 15 will become substantially fixed and aligned, as depicted in FIG. 14. The amount of time sufficient to substantially fix and align the charges within the insulating layer 15 will vary depending on the material of the insulating layer 15, the amount of heat used to increase the temperature of the insulating layer 15 and the amount of voltage potential exposed to the insulating layer 15.

An insulating material with an induced internal dipole moment, such as the insulating material 15 depicted in FIG. 14, comprises one means for providing a non-zero dipole moment between an electrode of the movable reflective layer 14 and an electrode of the fixed partially reflective layer 16 when no voltage is applied across those electrodes. Moreover, since the insulating material 15 has a substantially fixed and aligned dipole moment after performing the method described and illustrated in FIGS. 12-14, the insulating material 15 will have an internal non-zero dipole moment that exists when no voltage is applied across the electrodes of the movable reflective layer 14 and the fixed partially reflective layer 16. This non-zero dipole moment within the insulating layer 15 creates a more predictable electric field that may then be utilized to drive the interferometric modulator device 100.

In the embodiment depicted in FIG. 14, the voltage (V) normally supplied by the voltage source 35 to operate the interferometric modulator 100 may be lessened by an amount corresponding to the electric field supplied by the non-zero internal dipole moment of the insulating material 15. The amount of voltage ($\Delta V$) supplied by the non-zero internal dipole moment of the insulating material 15 corresponds to the strength of the electric field (E) supplied by the internal dipole moment of the insulating material 15 and the distance between the dipole moment (d), as illustrated by the equation $\Delta V = Ed$.

The charge movement in the insulating layer 15 that results from use of the method described and illustrated in FIGS. 12-14 may be observed by measuring the shift of operating voltage of an interferometric modulating device, where the operating voltage refers to the actuation voltage applied to the electrodes on the opposite sides of the insulating layer 15. Specifically, in an interferometric modulating device, the operating voltage is the voltage applied between the electrodes in the movable reflective layer 14 (also referred to as the membrane, mechanical layer, or column electrode) and the fixed partially reflective layer 16 (also referred to as the optical stack, or row electrode). The voltage shift may be obtained by measuring the voltage response of a test sample comprising a metal-insulator-silicon structure, where the insulator is made of the same material that forms the insulating layer 15 in an interferometric modulation device.

As an example, a procedure of applying a 15 volt bias over a layer of 1000 angstrom $Si_3N_4$ (silicon-nitride, dielectric constant 7.1) at 70° C. for 20 minutes can produce a polarization density of more than 1.67e-12 C-cm-1, that results in an observable voltage shift of 2 volts. This induced polarization varies with material of the films and the method used to prepare such films. As another example, treating a layer of 1000 angstrom $SiO_2$ deposited using the chemical vapor deposition (CVD) method with the same procedure as above may induce a polarization about 4.45e-13 C-cm-1, that results in an observable voltage shift of 1 volt. The polarization induced may depend on the thickness of the layer, the material of the layer, and the method of preparation. The result of the treatment is affected by the applied voltage, temperature, and duration of such treatment. A higher temperature typically produces a larger polarization in a shorter period of time. Similarly, a higher applied voltage, within the tolerance of the structure, typically induces a larger polarization. A typical range for temperature elevation used in testing and measuring integrated micro devices is between 50° and 85° C. This temperature range is compatible with an interferometric modulating device tolerance, and is thus suitable for conducting the present treatment. The sputtered silicon-oxide typically contains more trapping sites and impurities than the CVD oxide, thus allowing for a more pronounced charge movement and polarization.

Figure 15:
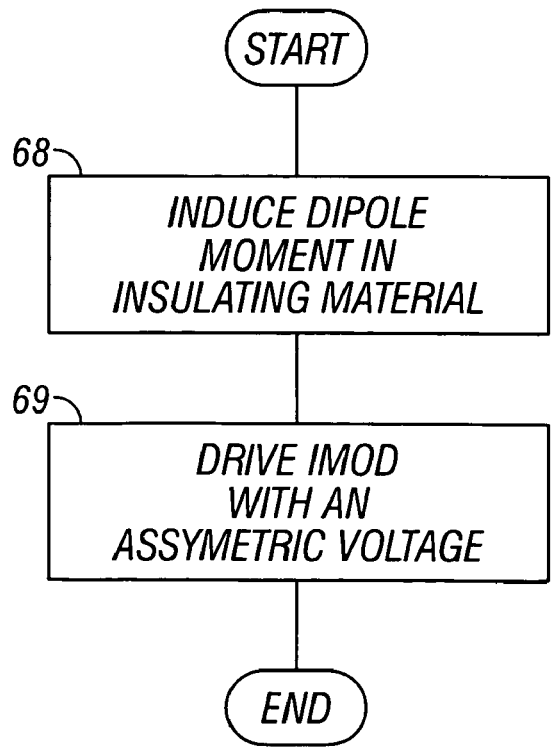
FIG. 15 is a flow chart of a method of driving an interferometric modulating device having an insulating layer with an internal dipole moment according to one embodiment of the invention.

Finally, the electric field created by the internal dipole moment within the insulating layer may be utilized to drive the interferometric modulating device. For example, a portion of the actuation voltage necessary to drive the interferometric light modulating device may be provided by the electric field created by the internal dipole moment within the insulating layer. FIG. 15 is a flowchart describing a method of driving an interferometric modulating device in accordance with one embodiment. The method starts, and then at step 68 an internal dipole moment is induced within the insulating material of an interferometric modulating device thereby substantially aligning and fixing the charges within the insulating material. This step may be accomplished, for example, by the method described and illustrated with reference to FIGS. 12-14. Then in step 69 the interferometric modulator may be driven (i.e. the optical cavity is collapsed at least partially) by an asymmetric voltage provided by the voltage source 35 that is asymmetric between negative and positive voltage, wherein the asymmetric voltage comprises an offset voltage corresponding to the electric field created by the internal dipole moment within the insulating layer from step 68. The method then ends after step 69.

The voltage provided by the voltage source 35 from step 69 may be asymmetric between positive and negative because, as depicted in FIGS. 13 and 14, the insulating layer 15 is typically disposed above the fixed partially reflective layer 16, which typically receives the negative component of the voltage potential (V). After step 68, the charges become substantially fixed and aligned within the insulating layer 15 with the positive charges drawn towards the movable reflective layer 14 and the negative charges drawn towards the fixed partially reflective layer 16. Thus, having the insulating layer 15 with the negative charges of the induced dipole moment disposed over the fixed partially reflective layer 16, the voltage necessary from the voltage source 35 to collapse or release the optical cavity 19 of the interferometric modulator 100 may be asymmetric, with a negative potential that is less in magnitude than the positive potential.

While the above detailed description has shown, described, and pointed out novel features of the invention as applied to various embodiments, it will be understood that various omissions, substitutions, and changes in the form and details of the device or process illustrated may be made by those skilled in the art without departing from the spirit of the invention. As will be recognized, the present invention may be embodied within a form that does not provide all of the features and benefits set forth herein, as some features may be used or practiced separately from others.

The invention claimed is:

1. A microelectromechanical systems (MEMS) device, comprising:
a first electrode;
a second electrode substantially reflective of light;
a first layer located between the first and second electrodes, the first layer comprising a non-zero dipole moment when no voltage is applied across the first and second electrodes; and
a second layer at least partially reflective of light, the second electrode in operable proximity to the second layer, wherein the second electrode is movable with respect to the second layer upon application of a voltage across the first and second electrodes.

2. The MEMS device of claim 1, wherein the first layer comprises a dielectric material.

3. The MEMS device of claim 1, wherein the first layer comprises a ferroelectric material.

4. The MEMS device of claim 1, wherein the first layer comprises $SiO_x$, wherein x is less than 2.

5. The MEMS device of claim 1, wherein the first layer comprises silicon nitride.

6. The MEMS device of claim 1, wherein the first layer comprises a material selected from a group consisting of: silicon oxide, silicon nitride, nitrided $SiO_2$, titanium oxide, semi-insulating polycrystalline silicon, and oxy-nitride.

7. The MEMS device of claim 1, wherein the second layer comprises the first electrode.

8. The MEMS device of claim 7, wherein the first layer is sputtered over the second layer.

9. The MEMS device of claim 1, further comprising:
a display;
a processor that is in electrical communication with said display, said processor being configured to process image data; and
a memory device in electrical communication with said processor.

10. The MEMS device of claim 9, further comprising:
a first controller configured to send at least one signal to said display; and
a second controller configured to send at least a portion of said image data to said first controller.

11. The MEMS device of claim 9, further comprising an image source module configured to send said image data to said processor.

12. The MEMS device of claim 11, wherein said image source module comprises at least one of a receiver, transceiver, and transmitter.

13. The MEMS device of claim 9, further comprising an input device configured to receive input data and to communicate said input data to said processor.

14. A microelectromechanical systems (MEMS) device, comprising:
means for at least partially reflecting light;
means for substantially reflecting light, the substantially reflecting means in operable proximity to the at least partially reflecting means;
first means for conducting electrical signals;
second means for conducting electrical signals, wherein the substantially reflecting means is movable with respect to the at least partially reflecting means upon application of a voltage across the first conducting means and the second conducting means; and
means for providing a non-zero dipole moment between the first conducting means and the second conducting means when no voltage is applied across the first conducting means and the second conducting means.

15. The MEMS device of claim 14, wherein the first conducting means comprises an electrode.

16. The MEMS device of claim 14, wherein the second conducting means comprises an electrode.

17. The MEMS device of claim 14, wherein the providing means comprises a dielectric layer.

18. The MEMS device of claim 14, wherein the providing means comprises a layer of $SiO_x$, wherein x is less than 2.

19. The MEMS device of claim 14, wherein the providing means comprises a layer of silicon nitride.

20. The MEMS device of claim 14, wherein the providing means comprises a material selected from a group consisting of: silicon oxide, silicon nitride, nitrided $SiO_2$, titanium oxide, semi-insulating polycrystalline silicon, and oxy-nitride.

21. The MEMS device of claim 14, wherein the at least partially reflecting means comprises the first conducting means.

22. The MEMS device of claim 14, wherein the at least partially reflecting means comprises a layer of indium tin oxide (ITO).

23. The MEMS device of claim 14, wherein the substantially reflecting means comprises a layer of aluminum.

24. A micro electromechanical systems (MEMS) device, comprising:
a first electrode;
a second electrode substantially reflective of light;
a first layer located between the first and second electrodes, the first layer configured to maintain a non-zero dipole moment during operation; and
a second layer at least partially reflective of light, the second electrode in operable proximity to the second layer, wherein the second electrode is movable with respect to the second layer upon actuation of a voltage across the first and second electrodes.

25. The MEMS device of claim 24, wherein the operation comprises actuation.

26. The MEMS device of claim 24, wherein the operation comprises relaxation.

27. The MEMS device of claim 24, wherein the first layer comprises a dielectric material.

28. The MEMS device of claim 24, wherein the first layer comprises a ferroelectric material.

29. The MEMS device of claim 24, wherein the first layer comprises $SiO_x$, wherein x is less than 2.

30. The MEMS device of claim 24, wherein the first layer comprises silicon nitride.

31. The MEMS device of claim 24, wherein the first layer comprises material selected from a group consisting of: silicon oxide, silicon nitride, nitrided $SiO_2$, titanium oxide, semi-insulating polycrystalline silicon, and oxy-nitride.

32. The MEMS device of claim 24, wherein the second layer comprises the first electrode.

33. The MEMS device of claim 24, wherein the first layer is sputtered over the second layer.

* * * * *